(12) United States Patent
Kanamaru et al.

(10) Patent No.: US 7,018,857 B2
(45) Date of Patent: Mar. 28, 2006

(54) METHOD OF MANUFACTURING A SEMICONDUCTOR DEVICE INCLUDING DEFECT INSPECTION USING A SEMICONDUCTOR TESTING PROBE

(75) Inventors: Masatoshi Kanamaru, Miho (JP); Takanori Aono, Chiyoda (JP); Tatsuya Nagata, Ishioka (JP); Kenji Kawakami, Ryuo (JP); Hideyuki Aoki, Takasaki (JP)

(73) Assignee: Renesas Technology Corp., Tokyo (JP)

( * ) Notice: Subject to any disclaimer, the term of this patent is extended or adjusted under 35 U.S.C. 154(b) by 206 days.

(21) Appl. No.: 10/459,598

(22) Filed: Jun. 12, 2003

(65) Prior Publication Data

US 2005/0074910 A1 Apr. 7, 2005

(30) Foreign Application Priority Data

Jun. 12, 2003 (JP) ............................. 2002-170774

(51) Int. Cl.
*H01L 21/66* (2006.01)
(52) U.S. Cl. ............................. 438/18; 438/17; 438/14
(58) Field of Classification Search ................ 438/5, 438/14, 17, 18
See application file for complete search history.

(56) References Cited

U.S. PATENT DOCUMENTS 6,358,762 B1 * 3/2002 Kohno et al. .................. 438/17
6,714,030 B1 * 3/2004 Kohno et al. ................ 324/754

FOREIGN PATENT DOCUMENTS

JP 9-133711 5/1997
JP 2001-250851 9/2001

* cited by examiner

*Primary Examiner*—Bradley K. Smith
(74) *Attorney, Agent, or Firm*—Antonelli, Terry, Stout and Kraus, LLP.

(57) ABSTRACT

A manufacturing method for improving the yield in a semiconductor manufacturing process and reducing the manufacturing cost produces a semiconductor device that is inexpensively manufactured and has a high reliability by reliably making contact during inspection with a suitable pressing force, while limiting damage to an electrode pad even when many inspected electrodes are inspected. A substrate used for inspection of the semiconductor device has a beam, a probe on the beam having a projecting shape for coming in contact with an electrode (electrode pad) of the semiconductor device, and a secondary electrode electrically connected to the probe through an electrically conductive member disposed on the side of the beam opposed to the side where the probe is provided. In an inspecting process, an inspecting device having a layer having many projections formed in the probe come in contact with the electrode pad of the semiconductor device.

17 Claims, 9 Drawing Sheets

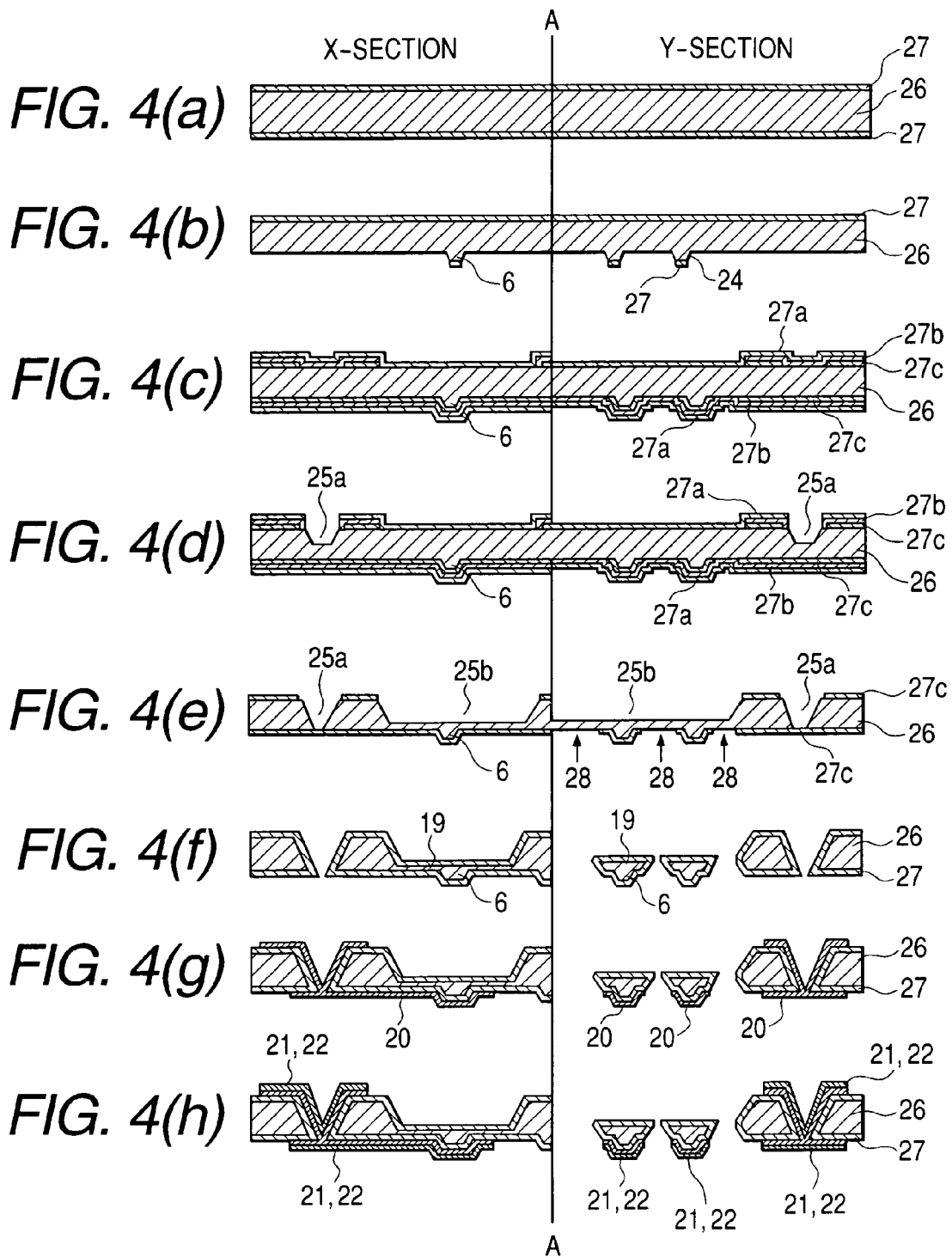

RELATION OF HARDNESS OF FILM SURFACE AND RESISTANCE VALUE

METHOD OF MANUFACTURING A SEMICONDUCTOR DEVICE INCLUDING DEFECT INSPECTION USING A SEMICONDUCTOR TESTING PROBE

BACKGROUND OF THE INVENTION

The present invention relates to a method of manufacture of a semiconductor device; and, more particularly, the invention relates to a technique for making an electrical connection from an inspecting device to a semiconductor device, that is formed in a semiconductor substrate, so as to carry out an inspection of the semiconductor device during the manufacture thereof.

A method of manufacture of a semiconductor device, such as an IC, an LSI, etc., is generally divided into a so-called pre-process, which includes steps carried out up to the formation of an integrated circuit on the surface of a silicon wafer, and a so-called after-process, which includes steps during which this silicon wafer is cut and separated into individual chips and is sealed by resin, ceramic, etc. In these semiconductor devices, the electrical characteristics of each circuit are inspected, and non-defective and defective products (chips) are judged in a chip unit at a predetermined stage during the pre-process.

With respect to "a probe structure body" that is used for the purpose of conducting an inspection with respect to a finely inspected object, such as an IC, electronic parts, etc., a bump contact projected in a hemispherical shape (dome shape) is formed to come into contact with the inspected object, and a concavo-convex structure is formed on the bump surface to improve the contact reliability. A known example is disclosed in laid-open in JP-A-9-133711 and JP-A-2001-250851. The former publication discloses a probe structure in which a bump contact arranged on one face of an insulating substrate and an electrically conductive circuit arranged on the other face are conductively connected. A very small projection is formed on the bump contact surface, and the probe structure is formed by a three-layer structure, including a deep layer made of nickel, a middle layer made of gold, and a surface layer made of rhodium. The latter publication also discloses a probe structure similar to that of the former publication, in which irregularities are formed by collecting very small grains on the bump surface. In both the former and the latter techniques, dull plating is applied as an irregular forming means.

In the structure of the bump surface described in the above-referenced publications, the inspecting contact portion of the bump surface has a large curvature, and so it is difficult to judge which portion of the bump comes in contact with the contact portion. It is also a problem that non of these structures is easily arranged at a high density, with the result that and it is difficult to cope with a product having a narrow pitch.

Further, when there are many object electrodes, it is difficult to control the height dispersion in the individual bump, since it is limited to a bump probe that is in contact with a very small area. Further, there is no specific description with respect to an appropriate contact pressurizing contact structure under such a situation.

SUMMARY OF THE INVENTION

Therefore, an object of the present invention is to provide a method of manufacture which is capable of solving the above-described problems, of improving the manufacturing yield in a semiconductor manufacturing process, and of reducing the manufacturing cost.

It is another object of the present invention to provide a method of manufacture which is able to supply a semiconductor device cheaply and with a high reliability by providing a process for reliably making contact by means of a suitable pressing force, while damage of an electrode pad is restrained, even when many electrodes are inspected.

To solve the above-described problems, in a process of manufacture of a semiconductor device, which includes a forming process for forming the semiconductor device on one principal surface of a wafer; and an inspecting process for inspecting the wafer to detect a defect in a semiconductor device formed in the wafer, a substrate for carrying out inspection in the inspecting process has a flexible beam formed therein, a probe of a projecting shape on the beam for coming in contact with an electrode of the semiconductor device to be inspected, and a secondary electrode electrically connected to the probe through an electrically conductive member on the side of the substrate opposed to the side on which the probe is provided. The process for carrying out the inspecting employs the above-mentioned device, in which a layer having many projections is formed in the probe which is designed to come in contact with the inspecting electrode of the semiconductor device. Thus, it is possible to carry out an inspection of the semiconductor device and more effectively manufacture the semiconductor device.

The present invention, it is further characterized in that the probe has a substrate portion constituting a projecting shape, a foundation layer formed on the substrate portion and having irregularities greater than those of the substrate portion surface, and an electrically conductive layer formed on the foundation layer.

The present invention is also characterized in that the foundation layer has nickel as a principal component, and the electrically conductive layer has gold as a principal component.

The present invention is further characterized in that the substrate portion is formed of a semiconductor material, and the electrically conductive layer includes one of rhodium, ruthenium, cobalt, chromium, tungsten and gold as a main element.

The present invention is further characterized in that a material harder than the electrically conductive layer is arranged in the probe substrate portion.

The present invention is further characterized in that the electrically conductive layer and the foundation layer are formed such that the interface of the foundation layer is coarser than the interface or the surface of the electrically conductive layer.

The present invention is further characterized in that the foundation layer surface is formed from a rectangular irregular face.

The present invention is further characterized in that a granular projection is formed in the probe and the secondary electrode.

The present is further characterized in that the surface of the electrically conductive member, that is arranged on the same side of the substrate as the probe is formed such that irregularities formed on the surface of the electrically conductive member are smaller than irregularities formed on the probe.

The present invention is characterized in that the inspecting device has a substrate, a probe formed on one principal surface of the substrate and having a surface having plural projections coarser than the substrate surface, wiring formed on the principal surface of the substrate on which the probe is provided and which is electrically connected to the probe, and an electrical connecting substrate arranged opposite to a face on the side opposed to the principal surface of the substrate and having a mechanism electrically connected to the wiring.

The present invention is further characterized in that an electrically conductive film that is higher in electrical conductivity than the substrate and a protecting film lower in electrical conductivity than the electrically conductive film are formed in the wiring.

The present invention is further characterized in that irregularities greater than those on the surface of the wiring are formed on the surface of the probe. In accordance with a construction in which many large projections are formed on the probe surface and such projections are not formed in the wiring on the same side, the effective wiring of the probe and the rear face electrode can be formed, while the possibility that the projections of the wiring portion may damage the inspected semiconductor device when they come in the electrical contact with the inspected semiconductor device is restrained.

The present invention is further characterized in that irregularities greater than those of the substrate around the probe are formed on the surface of the probe and the surface of the wiring. The inspecting device can be efficiently formed by forming irregularities in both the probe and the wiring surface. A stable inspection can be carried out, since stable electrical contact with an electrical connecting portion of the electrical connecting substrate, that is opposed to the secondary electrode can be obtained by further forming the irregularities on the secondary electrode.

With respect to the above characteristics, more effective characteristics can be obtained the characteristics are adopted in combination.

When many electrodes are collectively inspected, a contact method for reducing the flaws of an electrode pad at the inspecting time and reducing the pressurizing force and damage can be executed by using the above-described construction and structure. The contact can be reliably effected even in the case of plural probes and the electrode pad having an oxide film formed at several angstroms. As a result, a semiconductor element or electronic part can be very inexpensively provided.

Further, the present invention provides a method of manufacture in which it is possible able to obtain high reliability and high yield and supply a semiconductor device that has been inexpensively manufactured and which has a high reliability by efficiently inspecting the electrical characteristics of the semiconductor element during semiconductor manufacture, such as during a probing inspection, a burn-in inspection carried out in a wafer state, etc.

BRIEF DESCRIPTION OF THE DRAWINGS

FIGS. 4(a) to 4(h) are sectional views showing steps in a working process relating to one embodiment of the present invention.

DESCRIPTION OF THE PREFERRED EMBODIMENTS

The embodiments of the present invention will be explained with reference to FIGS. 1 to 12.

Figure 1:
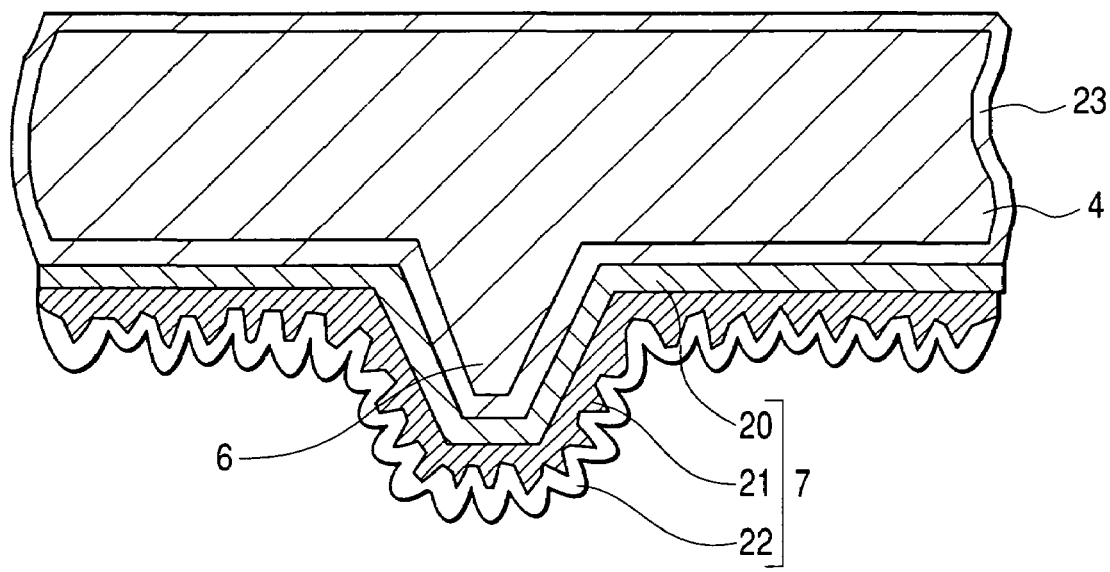
FIG. 1 is a detailed sectional view relating to one embodiment of the present invention.

FIG. 1 shows a typical example of the present invention. FIG. 1 is an enlarged sectional view of one portion of a substrate for use in semiconductor inspection to detect a defect in a semiconductor device. A probe 6 is formed in the substrate 4 for an inspection, and its circumference is covered with an insulating layer 23. A multi-layer wiring 7 is formed on one principal surface of this substrate 4. The multi-layer wiring 7 is formed in the order of a close attaching layer 20, a foundation layer 21 and an electrically conductive layer 22, arranged from the substrate surface side. The close attaching layer is provided to improve the close attaching property of an insulating layer and the close attaching layer. For example, when silicon dioxide is used in the insulating layer, titanium and gold are formed in the close attaching layer.

Irregularities having a crest interval of 3 µm or less are formed on the surface of the foundation layer. As a method of forming such irregularities, for example, the irregularities can be formed by performing needle-shaped nickel plating, with nickel as a principal component. The surface, after this needle-shaped nickel plating, is formed in a rectangular shape in which many corners exist. The foundation layer has large irregularities in comparison with the surface of the substrate for inspection, i.e., the surface including the insulating layer and the close attaching layer.

The electrically conductive layer is formed on this foundation layer along the irregularities of the foundation layer. This state is a state in which hemispherical crest portions are continuously connected to each other, as seen in external appearance. This is a structure formed by setting the irregularities of the foundation layer to a core and growing the material of the electrically conductive layer while this material is fixed around these irregularities. Therefore, in comparison with general dull plating, the interface of the foundation layer and the electrically conductive layer has a sectional shape formed such that both of the layers are mixed with each other. In the case of the present invention, a portion constituting a core exists. In comparison with the present invention, no portion constituting a core exists in the case where dull plating is employed.

The material of the electrically conductive layer is preferably formed of a material having gold as a principal component, and it is more preferably formed of a material including a material, such as nickel, copper, and cobalt, in gold. The hardness of the electrically conductive layer approximately ranges from about 100 to about 400 in Knoop hardness. In accordance with the present invention, when silicon is applied to the substrate for inspection, a needle-shaped nickel plating structure can be applied to the foundation film, and a material having gold as a principal component, and other materials, e.g., materials such as rhodium, ruthenium, chromium and tungsten, can be applied to the electrically conductive layer. In this case, it is preferable to use a construction in which gold having a thickness of about 0.1 μm is nipped to improve the close attaching property of the respective materials of the needle-shaped nickel plating layer and the electrically conductive layer. It is possible to break a surface oxide film of aluminum and obtain a preferable contact resistance by using such a construction, even in an electrode pad formed by, e.g., aluminum, etc.

A large compression force is applied to the probe formed in the substrate for inspection at the time of contact with the electrode pad. Therefore, it is preferable to set the hardness of the probe material so that it is harder than that of the electrically conductive layer formed on the probe surface.

Further, since irregularities are formed in the foundation layer 31 by using needle-shaped plating, the surface of the foundation layer 31 is coarsely formed in comparison with the insulating layer 23, the close attaching layer 20 or the substrate 4. When the interface or the surface of the electrically conductive layer 22 and the interface or the surface of the foundation layer 21 are compared with each other, the interface or the surface of the foundation layer is more coarsely formed. This is because fine grains are grown on the coarse surface, and the grains grown later are grown while this coarseness is buried by these grains. The foundation layer 21 and the electrically conductive layer 22 are formed by a plating technique. It is sufficient to form the above-described multi-layer wiring structure only around at least the probe, and the other multi-layer wirings may have a structure different from that which exists around the probe.

The electrical characteristic inspection of a semiconductor device formed in a wafer can be generally divided into a probing inspection for judging whether a conductive connection between respective circuits is good or bad, a burn-in inspection for acceleration-selecting a defect by applying a thermal electric stress to a circuit at a high temperature of about 150° C., and a final inspection for finally performing the inspection at a high frequency. The various kinds of inspecting methods mentioned above are common with respect to an electrical conductive connection of the inspected wafer or the inspected chip and an external inspecting system. An inspecting device having these structures is pressed against an electrode pad made of an individual aluminum alloy or other alloys, which is patterned on the inspected wafer at a pitch of several ten to one hundred and several tens μm, and which is several tens to one hundred and several tens μm in square area and about 1 μm in thickness.

Figure 2:
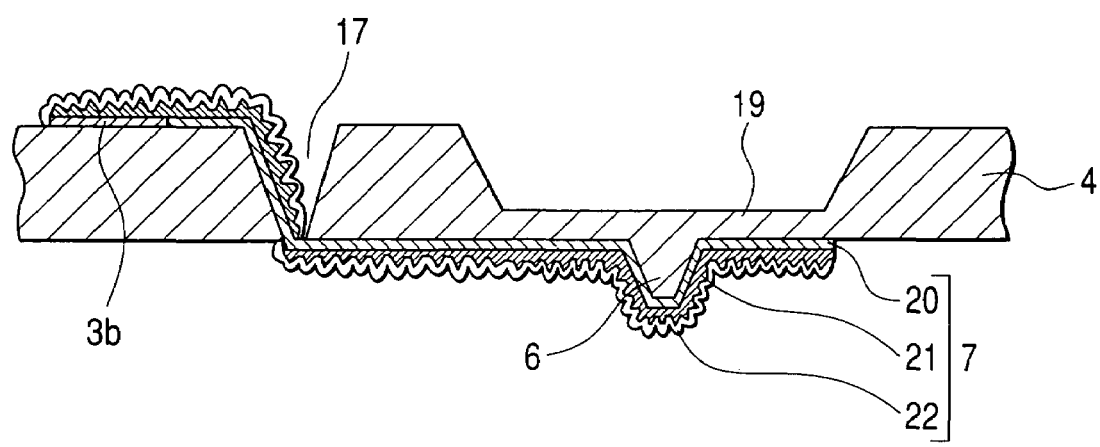
FIG. 2 is a sectional view relating to one embodiment of the present invention.

An example of the application of silicon to a substrate for inspection will be explained next. FIG. 2 shows a sectional view in which the multi-layer wiring structure of the present invention is applied to a body having a probe, a beam and a through hole processed by using a micro-machining technique in the substrate for inspection. The body has a probe 6 of a projecting shape, a semiconductor substrate 4 for inspection, having a beam 19 formed as a probe support portion that is physically continuously connected to the probe 6, a multi-layer wiring 7, which serves as an electrically conductive layer, having many irregularities formed on the projection, and an electrode pad 3b, which serves as a secondary electrode. The electrode pad 3b is formed on the side opposed to the side on which the projection is formed in the above substrate, and it is electrically connected to the electrically conductive layer 22 on the projection through the multi-layer wiring 7, which serves as an electrically conductive member, formed on the side of the projection in the substrate and on the opposed side.

More specifically, both the probe 6 and the support beam 19 are formed as an integral structure in the substrate 4 for inspection. This probe 6 and support beam 19 are formed according to the number of electrode pads required for inspection. Therefore, plural probes 6 and plural support beams 19 are actually formed. The multi-layer wiring 7 is connected to the electrode pad 3b, which is formed on the face opposed to the probe forming face, through a through hole 17, which is formed by etching in the substrate for inspection, from the probe tip. In the above structure, the close attaching layer 20, the foundation layer 21 and the electrically conductive layer 22 that make up the multi-layer wiring 7 are continuously formed from the probe to the electrode pad, as well as on the probe periphery. This is because the foundation layer and the electrically conductive layer are formed by a plating technique, as mentioned above. In this case, one of electrolytic plating and electroless plating can be used. A detailed example of the process of formation of the above-described body will be explained later with reference to FIGS. 4(a) to 4(h).

Figure 3A:
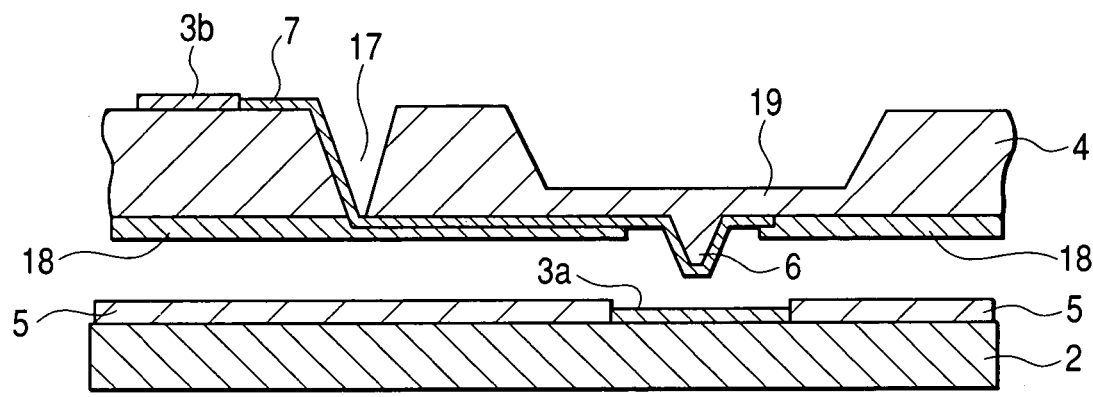
FIGS. 3(a) and 3(b) are sectional views relating to an inspecting method of the present invention.
Figure 3B:
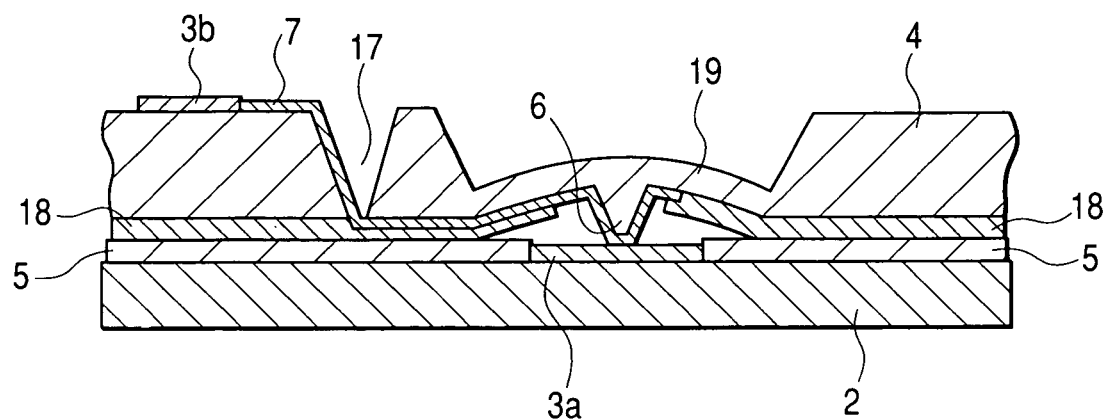

An example of the pressing operation performed by the substrate for inspection will be explained next with reference to FIGS. 3(a) and 3(b). FIG. 3(a) is a sectional view of the substrate before the inspection, and FIG. 3(b) is a sectional view thereof during the inspection. The substrate 4 for inspection is constructed of a silicon material, and both the end support beam 19 and the probe 6 on the end support beam are formed of this material. The probe 6 and the secondary electrode pad 3b are connected to each other through the through hole 17. A protecting film 18 is partially formed on the multi-layer wiring 7 which comes in contact with the inspected wafer. In contrast to this, in the inspected wafer 2, a portion other than the electrode pad 3a for inspection is higher by several μm than the electrode pad 3a, and it is formed of a surface protecting film 5 made of a polyimide-based resin. Thus, when the multi-layer wiring 7 that is connected to the probe 6 is formed on the probe forming face side around the probe 6, the surface of the probe 6 has irregularities, and so the wiring therearound is covered with the surface protecting film 5. Namely, the irregularities of the wiring 7 are smaller than those of the surface of a portion of the probe 6.

In accordance with the present invention, the relative positional accuracy of the silicon probe is very good, since the silicon is processed by utilizing a micro-machining technique. This is because the positional accuracy depends on the mask accuracy. The general mask accuracy is ±1 μm or less, and the relative positional accuracy of the processed probe also lies within this range.

When the substrate 4 for inspection comes in contact with the electrode pad 3a of the inspected wafer 2, as seen in FIG. 3(b), the end support beam 19 is deformed to an arc shape, and the probe 6 perpendicularly comes in contact with the electrode pad 3a. At this time, the repulsive force due to flexure (elastic deformation) of the end support beam is applied to the electrode pad 3a as pressing force. Therefore, the pressing force can be controlled by the sectional shape of the beam and the beam length, and so it is possible to obtain preferable contact having a shallow flaw using a low pressing force with respect to the electrode pad. Further, since any indentation that is formed in the electrode pad is small, no disadvantage is caused even when an electrical connection to another substrate is established in the next process, e.g., even when a solder ball is used.

Thus, when silicon is applied to the substrate for inspection, the pressing force can be controlled. Further, that additional load to the probe also becomes constant, since the contact with the electrode pad is repeated with a constant pressing force. Therefore, in the structure in which a constant pressurizing force is applied between the probe and the support beam, in which needle-shaped nickel plating and the irregularities of gold or rhodium, etc. are formed in the probe formed on the substrate for inspection, in accordance with the present invention, the dispersion of a breaking way of the irregularities is small, and the useful life of the probe can be lengthened.

The present invention has been mainly explained with respect to a beam that is supported at both ends. However, for example, the present invention also can be applied to a cantilever beam. In this case, the cantilever beam is more or less scrubbed in its contact with the electrode pad, although it depends on the probe height. Therefore, a hard metal, such as rhodium, etc. is preferably formed on the needle-shaped nickel in a combination of the foundation layer and the electrically conductive layer in this case.

An example of the process of formation of the substrate for inspection using a micro-machining technique that is excellent for mass production will be explained next with reference to FIGS. 4(a) to 4(h). The X-section in each of these figures is a section as seen from the longitudinal direction of the beam, and the Y section is a section as seen in the direction perpendicular to the longitudinal direction of the beam.

A silicon wafer 26, which is 525 μm in thickness and (100) in azimuth, is first prepared as shown in FIG. 4(a). Next, a thermal oxide film which is 0.5 μm in thickness is formed. Further, resist coating, pattern exposure, development and etching of the thermal oxide film are performed on the thermal oxide film 27 that is formed on the surface of the silicon wafer 26 from one face by using a photolithography process. Thus, a mask pattern for forming a probe 6 is formed. At this time, a compensating pattern for coping with a corner drop due to the etching is formed in the mask pattern shape to obtain a probe tip shape as an object.

Thereafter, silicon having 30 μm in step difference is anisotropically etched from one face using a potassium hydroxide aqueous solution at 68° C., and the probe 6 is formed, as shown in FIG. 4(b). At this time, a slant face constructed by a {111} crystal face 24 is formed in a probe forming portion. In the etching processing of silicon, other wet etching liquids, e.g., ethylene diamine pyrochatechol, tetra methyl ammonium hydroxide, and hydrazine, can be also used, as well as the potassium hydroxide aqueous solution. Further, a multi-layer mask method cab be used to collectively perform the etching processing of holes having different depths by using time differences in the processing.

As shown in FIG. 4(c), oxidation, resist coating, pattern exposure, development, etching of a thermal oxide film, and oxidation are repeatedly performed by using the photolitho process. More particularly, patterning is sequentially performed from a shallow hole after the oxide film is formed. In the substrate for inspection, in the structure shown in FIGS. 4(a) to 4(h), there are three different kinds of holes. An oxide film 27c is first formed, and the patterning for separating the probe is performed. Next, oxidation is performed on both faces, whereby an oxide film 27b is formed, and patterning is carried out for etching the beam until a predetermined thickness is obtained. Next, the oxidation of both faces is again performed, whereby an oxide film 27a is formed.

As shown in FIG. 4(d), after the patterning of the deepest etching hole 25a is performed, the anisotropic etching processing is performed until the hole reaches midway.

As shown in FIG. 4(e), the oxide film 27a of the second deepest hole is removed, and the anisotropic etching processings of a first hole 25a and a second hole 25b are simultaneously performed until a predetermined depth is reached.

Next, as shown in FIG. 4(f), after the oxide film 27b is removed, the anisotropic etching is performed from the direction shown by an arrow 28, using the oxide film 27c as a masking material, so that parts formed of the probe 6 and the support beam 19 are separated from each other. At this time, the material actually manufactured on trial can be processed, such that the beam is 30 μm in thickness and has a narrow pitch of 85 μm between the probes.

In the above-described processing technique, an example of the application of a thermal oxide film to the mask material of the anisotropic etching has been explained. However, a silicon nitride film, and a composite film having a silicon nitride film formed on a thin thermal oxide film, also may be used as the mask material.

In the process of formation of the above-described structure body, silicon is processed by using an anisotropic etching technique, but dry etching processing also can be used in addition to this technique. This dry etching processing can produce a vertical wall with an aspect ratio of about 20 when using a plasma etching [ICP-RIE (Inductively Coupled Plasma-RIE) device of the induction coupling type.

Thereafter, as shown in FIG. 4(g), after the oxide film 27, which is 3 μm in thickness, is formed on the entire face of the body, a metallic thin film is formed on both faces of the oxide film 27 using a sputtering device. A close attaching layer 20 is then patterned on both faces by use of a photolitho process using an electrocoating resist. Thus, wirings are connected to each other on both faces of the substrate for inspection. For the metallic thin film, chromium which is 20 nm in thickness is formed, and gold which is 1000 nm in thickness is formed on the chromium. Chromium is formed to improve the close attaching property of the gold and the thermal oxide film, and titanium can be also used in addition to chromium. Another material also may be used as the wiring material, if this material does not dissolve at 150° C. or more and can be formed as an electrically conductive thin film. In a device used in wiring, etc., a device other than the sputtering device, e.g., an evaporation device and a CVD (Chemical Vapor Deposition) device, may be used as well. Further, the method of forming the wiring is not limited to a liftoff method. For example, after the thin film is formed on the entire face of the substrate by using an electro-deposition resist, or a resist that able to three-dimensionally form the resist pattern using a spray resist coating device, etc., the photolitho process is performed, and the wiring may be formed by etching and may be then formed by plating.

Next, as shown in FIG. 4(h), copper which is 3 μm in thickness and nickel which is 0.5 μm in thickness are formed by using an electrolytic plating device. Thereafter, needle-shaped nickel plating is performed so that the plating thickness is 1 μm. Thus, a foundation layer 21 is formed. Thereafter, gold plating is performed on the surface of this foundation layer, such that the plating thickness is 0.5 μm. Thus, an electrically conductive layer 22 is formed. At this point, multi-layer wiring is completed.

Figure 5:
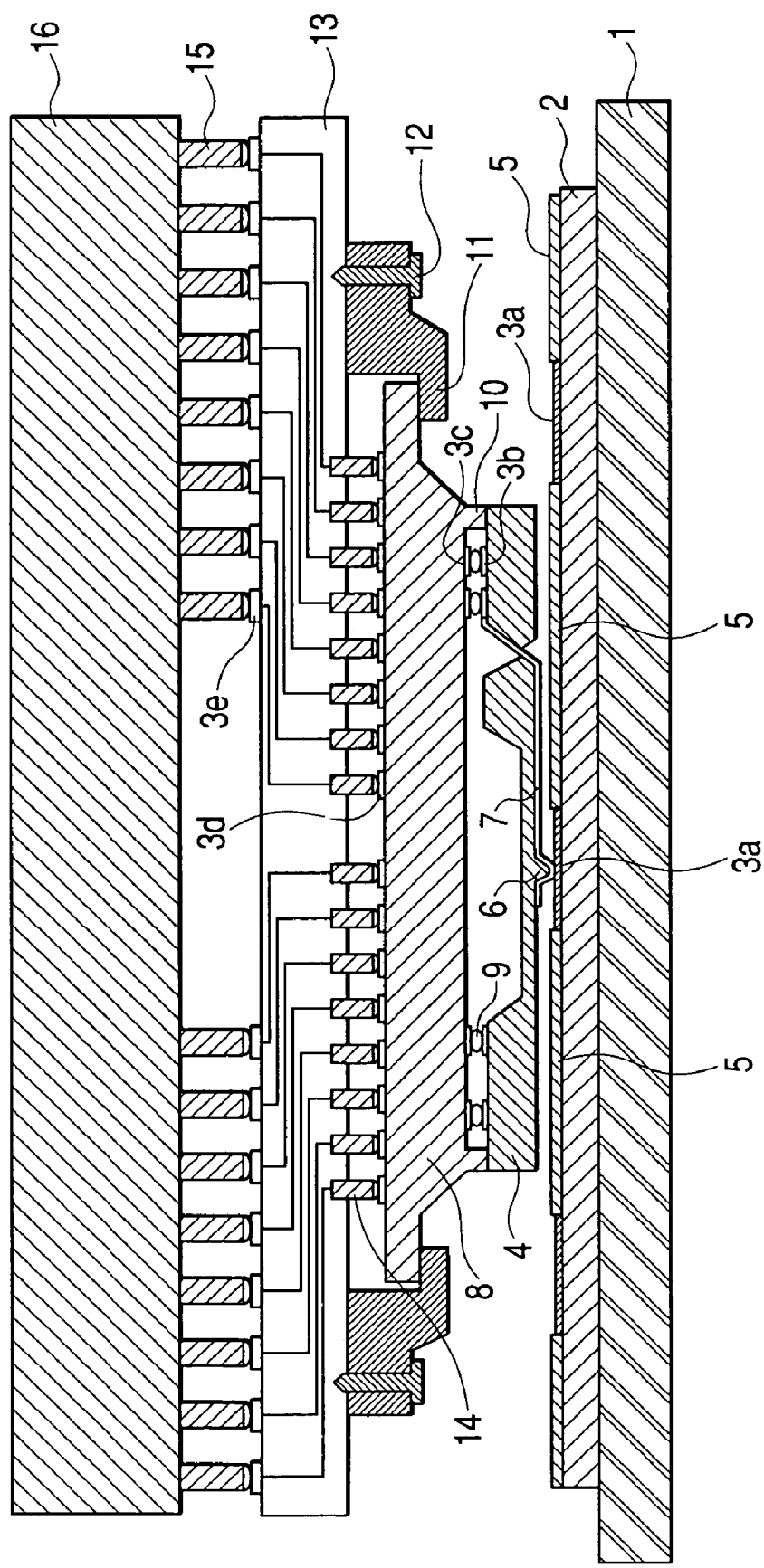
FIG. 5 is a sectional view relating to one embodiment of the present invention.

The structure of a wafer inspecting device relating to one embodiment of the present invention will be explained with reference to FIG. 5. In the construction of the wafer inspecting device of the present invention, as shown in FIG. 5, a support beam that is easily deformed is formed in the substrate 4 for an inspection, and a probe 6 is formed in this support beam. With respect to the substrate 4 for inspection, a multi-layer wiring 7, which is made of a metal, is formed through an insulating layer and is continuously connected from the probe to an electrode pad 3b, that is formed on the side of the substrate opposed to the probe forming face, through a through hole 17.

The substrate 4 for inspection is fixed to an electrical connecting substrate 8 by way of solder balls 9. In accordance with the present invention, the joining of the probe forming substrate and the electrical connection are simultaneously carried out by using the solder balls. However, another method, e.g., a method for performing electric conduction and fixing of the probe forming substrate by forming and burning silver paste and platinum paste, or a metallic material and a composite material undissolved at 150° C. or less, by a screen printing method, etc., also may be used. A multi-layer wiring is formed within the electrical connecting substrate 8, and it plays a role of accommodating the electrode pads 3c, which are arranged at a narrow pitch, to the layer interval of the spring probes 14 that are arranged in the upper portion of the electrical connecting substrate. The electrode pads 3c, that are provided in the electric connecting substrate 8, are formed at a pitch of 800 μm in a matrix shape. The material of this electric connecting substrate is preferably ceramics, and it is particularly constructed using mullite, in view of the coefficient of linear expansion thereof. Since the burn-in inspection within various kinds of inspections is made within a temperature atmosphere of 150° C., it is preferable to set the coefficients of linear expansions to be close to each other so as not to relatively cause a position of shift in the electrode pad of an inspected wafer that is formed of silicon and the probe. Further, a projection 10 for preventing buckling is formed in the electrical connecting substrate 8 so as to prevent damage to the solder balls 9 in response to the pressurizing force applied at the time of inspection. The electrical connecting substrate 8 and the probe forming substrate 4 mentioned above are fixed to a multi-layer wiring substrate 13 through a jig 11 by bolts 12. A material having a small thermal deformation at 150° C. or more, e.g., aluminum nitride or invar, are preferably used as the material of the jig 11. The interior of the multi-layer wiring substrate 13 consists of a structure in which multi-layer wiring is formed in a glass-reinforced epoxy, and many spring probes 14 are formed and are connected to the internal multi-layer wiring. The spring probe is an electrically conductive terminal having a spring mechanism. In a wafer inspecting device 16, a spring probe or connecting pin 15, that is used for electrical connection to the multi-layer wiring substrate 13, is arranged at the interval of the electrode pads 3e of the multi-layer wiring substrate.

In the wafer inspecting device 16, the method for effecting electrical connection with respect to the multi-layer wiring substrate 13 is not limited to the above-described system, but a member, such as a connector, may be also used, if this member is able to make the electric connection.

Two substrates, formed by the electrical connecting substrate and the multi-layer wiring substrate, are interposed between the probe forming substrate and the wafer inspecting device, because the cost is very high, and the substrate is not easily changed since the multi-layer wiring is formed within ceramics in the electric connecting substrate. Therefore, changes in the inspecting system and a contact can be made by using a multi-layer wiring substrate which is inexpensively manufactured. In the case of application to another inspecting device, the application can be easily made by changing the multi-layer wiring substrate that is inexpensively manufactured. It is possible to effect direct connection to the multi-layer wiring substrate without using the above electric connecting substrate, in accordance with the electrode pad number and the electrode pad interval.

The wafer 2 is fixed to a fixing stage 1 by a vacuum chuck. This fixing stage 1 is set to have a height control mechanism operable in a unit of several tens of μm and a structure that is able to control the pressurizing force in a unit of several grams by a peripheral device. The fixing stage 1 is also set to have a structure capable of being moved up and down, leftward and rightward, and in a circumferential direction. The fixing stage 1 is further provided with a structure in which the electrode pad 3a that is formed in the wafer 2 and the probe 6 of the substrate 4 for inspection can come in contact with each other, while the electrode pad 3a and the probe 6 are aligned with each other in position with a high accuracy. Further, in the above structures, a moving function for effecting position alignment is added to the fixing stage side. However, the present invention is not limited to the above-mentioned structures. For example, the moving function for the position alignment also may be added to the substrate side, it may be provided or both on the substrate side and the fixing stage side.

A structure relating to an electric conducting means for transmitting and receiving an electric signal between the wafer inspecting device 16 and the inspected wafer 2 will be explained. After positional alignment of the wafer 2 and the substrate 4 for inspection has been completed, the substrate for inspection is pressed against the surface protecting film 5 of the wafer, when both the wafer 2 and the substrate 4 for inspection come in contact with each other using the above-described mechanism. Thus, the effect of any warp and inclination of the wafer are restrained. As explained above, the center portion of the support beam of the substrate for inspection is flexed upward, and a constant pressing force is applied to the electrode pad 3a by its repulsive force. In accordance with the present invention, the pressing force required for electrical conduction is about 50 mN. If the pressing force is applied at this value or more, the necessary electrical conduction is preferably obtained. However, when the pressing force is too large, the electrode pad 3a may be damaged, and the irregularities of the probe surface also may be damaged. An electrode pad having a size of about 80 μm square and made of aluminum is formed in the wafer 2. The surface protecting film 5 made of polyimide-based resin is formed around this electrode pad to prevent a contact defect, etc. Further, an insulating film 18 made of polyimide-based resin, etc. is formed on the wiring of the probe forming substrate, except for the electrode pad 3b and the probe 6, so as to bury the step difference of the multi-layer wiring.

Another insulating material also may be used in the above-mentioned insulating film of the probe forming substrate surface, if this material is a material that will not damage the surface protecting film 5 and is able to resist at least a temperature of 150° C. or more. The wiring also may be constructed by using a structure in which a groove is formed in the probe forming substrate and the-wiring is buried within this groove.

The electrode pad 3a is electrically connected to the probe 6 of the probe forming substrate 4 by coming in contact with this probe 6. A metallic wiring is formed from the probe 6 of the probe forming substrate 4 to the electrode pad 3b, that is formed on the face opposed to the probe forming face of the probe forming substrate. The electrode pad 3b of the probe forming substrate 4 and the lower face electrode pad 3c of the electrical connecting substrate 8 are electrically connected by a solder ball. The lower face electrode pad 3c of the electrical connecting substrate 8 and the upper electrode pad 3d are electrically connected by the multi-layer wiring formed within the electrical connecting substrate 8. An electrical signal is transmitted and received by using a spring probe that is mounted on the multi-layer wiring substrate 13 between the upper face electrode pad 3d of the electric connecting substrate 8 and the multi-layer wiring substrate 13. A spring mechanism is added to the spring probe. Therefore, for example, even when a bulge or recess, etc. are prevent in the substrate, the electrical connection can be reliably obtained without causing a conductive defect. Further, since a spring probe is adopted in this example, the portion below the electrical connecting substrate 8 can be easily exchanged, such as when the object of inspection is changed. The spring probes mounted on the multi-layer wiring substrate 13 are connected to the electrode pads 3e formed on the upper face of the multi-layer wiring substrate 13 by the internal wiring of the multi-layer wiring substrate. The spring probe formed in the inspecting device or a connecting terminal 15 is used for the electrical transmission and reception of signals with respect to the final wafer collective inspecting device 16.

The electrical signal can be transmitted to and received from the electrode pad of the wafer by the inspecting device using various kinds of substrates arranged as mentioned above. As described above, since the portion below the electrical connecting substrate can be easily exchanged in the inspecting device for making various kinds of inspections, the present invention can be applied to such inspecting methods as a probing inspection for discriminating whether the conductive connection between respective circuits is good or bad at a driving frequency of 30 MHz, a burn-in inspection for acceleration-selecting a defect by applying a thermal electric stress to a circuit for several to several tens of hours at a high temperature of about 150° C. at a driving frequency of 5 MHz, a final inspection finally made at a high driving frequency of 133 MHz or more, etc.

The present invention is not limited to the above-described probing inspection, but also can be used in other inspecting systems. For example, when an electrical characteristic inspection is continuously carried out in a state in which a burn-in inspection is packed at a wafer level, the present invention also can be used, since contact between the electrode pad and the probe is reliably obtained.

It is generally preferable to set the contact area with an electrode pad portion to be larger so as to reduce the contact resistance. However, when it is assumed that the pressing force is the same, the contact resistance is reduced as the area of a probe tip is reduced. This is because an oxide film, etc. can be easily broken even when the oxide film, etc. exists on the electrode pad surface, since the face pressure is raised with the same pressing force, as the probe tip area is reduced.

Therefore, simulations were performed to determine what influence is caused on the electrode pad surface, with respect to a structure having irregularities formed in the probe tip portion and a structure having no irregularities formed at the probe tip.

Figure 6A:
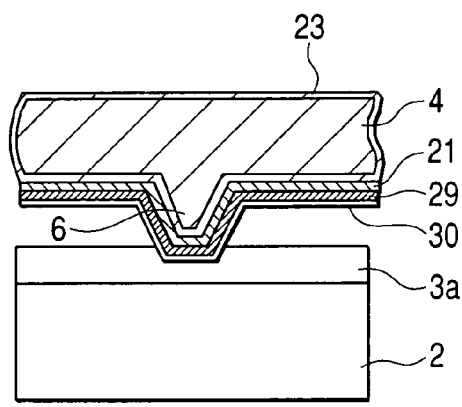
FIGS. 6(a) to 6(d) are diagrams illustrating a probe contact with respect to an electrode pad.
Figure 6B:
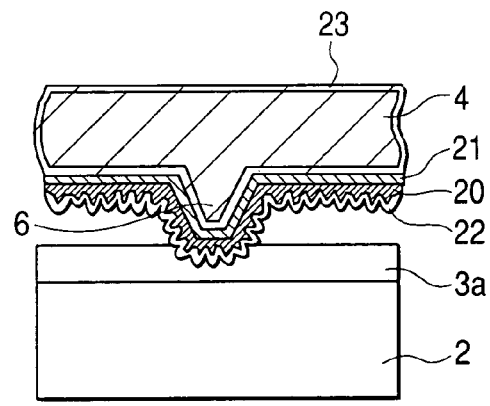
Figure 6C:
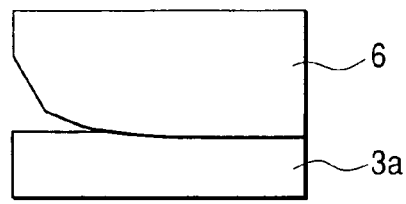

FIGS. 6(a) to 6(d) show these results, as one example. FIG. 6(a) is a sectional view showing an example in which a probe having a structure in which no irregularities are formed therein is pressed against the contact 3a. In this structure, an insulating layer 23, a close attaching layer 21, a nickel layer 29 and a gold layer 30 are formed on the surface of the probe 6 of the substrate 4 for inspection, and the probe comes in contact with the electrode pad 3a, which is made of aluminum and is mounted in the wafer 2. FIG. 6(c) shows an enlarged view of the contact made at this time.

Figure 6D:
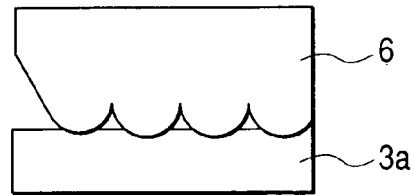

FIG. 6(b) is a sectional view showing an example in which a probe having a structure in which irregularities are formed therein is pressed against the contact 3a. In this structure, an insulating layer 23, a close attaching layer 21, a foundation layer 20 and an electrically conductive layer 22 are formed on the surface of the probe 6 of the substrate 4 for inspection, and the probe comes in contact with the electrode pad 3a, which is made of aluminum and is mounted in the inspected wafer 2. FIG. 6(d) shows an enlarged view of the contact made at this time. As can be seen from the results shown in FIGS. 6(c) and 6(d), the electrode pad 3a is not deformed so much in the case of FIG. 6(c). In contrast to this, a deformation of the electrode pad 3a notably appears in the case of FIG. 6(d). It can be seen from these results that the probe with a structure having an irregularities on the surface can break the oxide film of the electrode pad surface with a low pressurizing force.

In providing an optimum irregular shape for breaking the oxide film of the electrode pad surface, it is preferable to set the thickness of the electrode pad according to a radius as seen from the simulation results. The thickness of the electrode pad used in a semiconductor element at present is about 0.6 μm. Accordingly, the irregularities required to inspect such an electrode pad need to have a structure in which a hemisphere having a pitch of 1.2 μm is continuously formed. As one example, the irregularities are set so as to lie within a range from about 1.8 times to about 2.2 times the thickness of the electrode pad.

Figure 7:
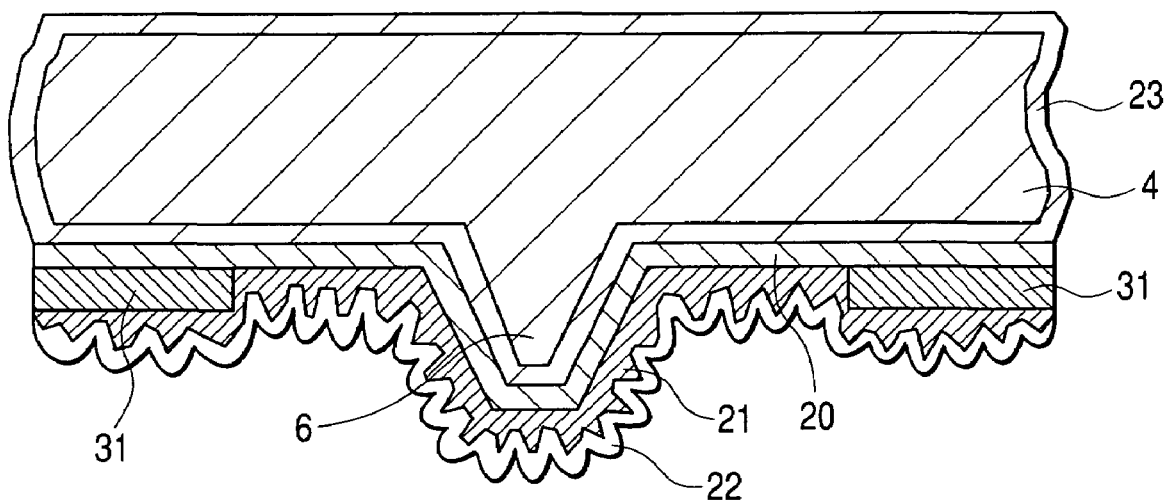
FIG. 7 is a detailed sectional view relating to another embodiment of the present invention.

In the wiring connected from the probe tip to the electrode pad that is formed on the face opposed to the probe forming face, it is necessary to reduce the resistance value of the wiring. This resistance value is reduced to obtain a driving frequency, an inspecting speed, etc. as required in the inspection. FIG. 7 shows an embodiment relating to another wiring structure of the present invention. As seen in FIG. 7, an insulating film 23 is formed on the surface of the substrate 4 for inspection, on which the probe 6 is formed. In the wiring on its surface, a foundation layer 21 having irregularities is formed on the close attaching layer 20, and an electrically conductive layer 22 is formed thereon. A low resistance layer 31 is formed in the wiring area, including the probe support beam portion, except for the area of the probe. For example, the low resistance layer 31 has a resistance lower than that of the electrically conductive layer 22.

When the thickness of the plating is increased, the shape of the foundation will generally gradually vanish. Therefore, the probe is changed to a shape close to that of a bump. In the probe of the present invention, a flat portion is formed in the probe tip portion by utilizing a silicon crystal. Therefore, when the plating is thickly formed in the probe tip portion, the above-mentioned flat portion tends to vanish. Therefore, in accordance with the present invention, the low resistance layer is used to reduce the wiring resistance, and it is removed only near the probe to prevent the possibility that the probe shape will greatly change due to the presence of the wiring material.

In the method of forming the above-described wiring structure, a mask is formed so as to prevent the copper of the low resistance layer from attaching to a probe peripheral portion. Thereafter, electrolytic copper plating and electrolytic nickel plating are performed. Thereafter, the mask is removed, and a foundation layer and an electrically conductive layer are formed. Thus, the contour of the probe shape formed by the anisotropic etching of silicon is not greatly affected by the plating, and so the dispersion of the individual probe shape is small.

Figure 8:
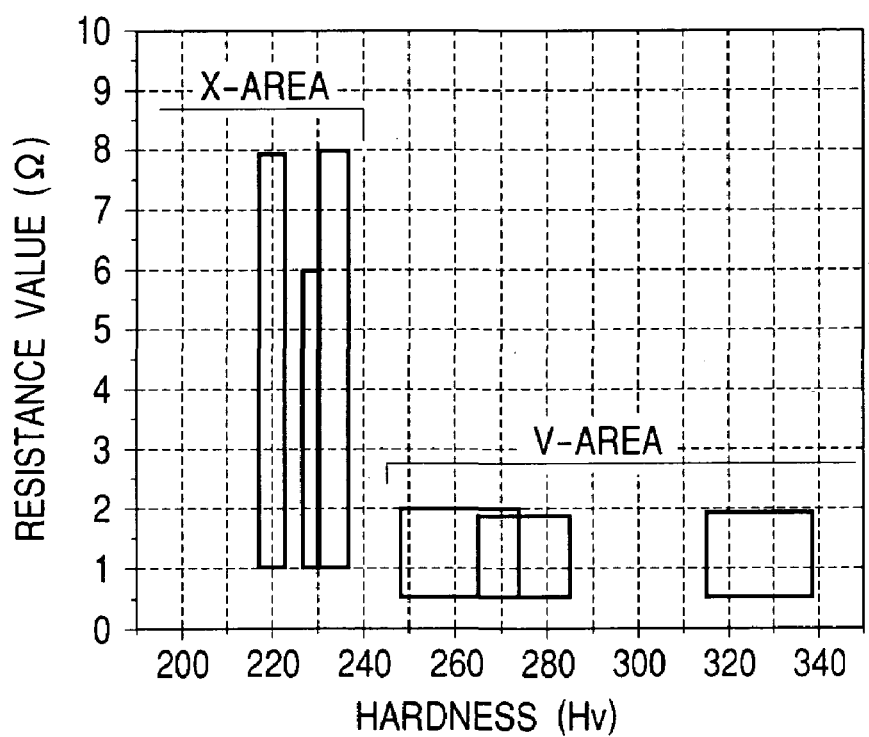
FIG. 8 is a graph showing a relationship between film hardness and a resistance value.
Figure 9:
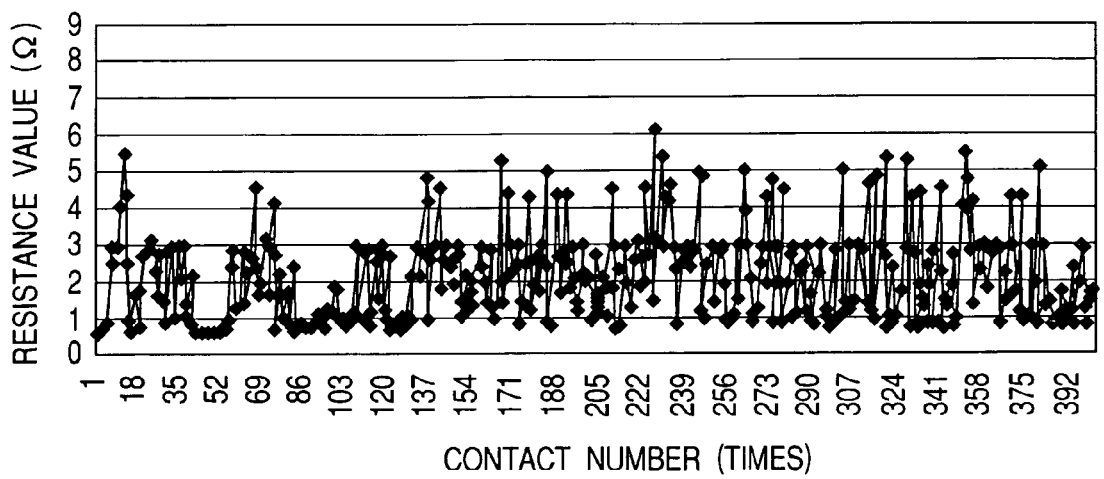
FIG. 9 is a diagram showing resistance values over the life of a probe.
Figure 10:
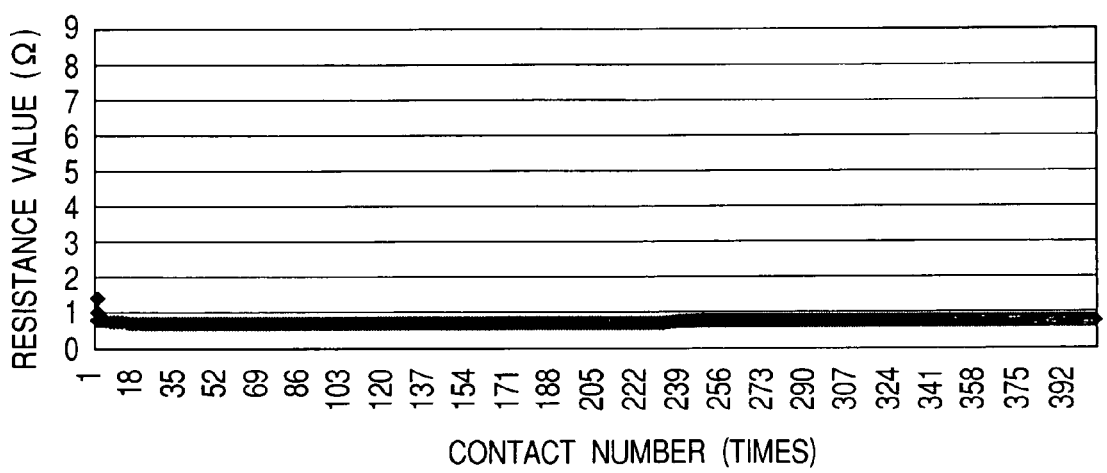
FIG. 10 is a diagram showing resistance values over the probe life.

FIG. 8 shows the results of examination with respect to the hardness of a probe tip portion forming the foundation layer and the electrically conductive layer therein, and FIGS. 9 and 10 show the resistance change during a life testing.

In FIG. 8, the axis of abscissa represents the micro-Vickers hardness (Hv) measured by a micro-Vickers tester, and the axis of ordinate the resistance values of an electrode pad made of aluminum and a pad formed on the face opposed to the probe forming face. The measuring load in the micro-Vickers tester was constantly set to 250 mN. This measuring load is a load in which an indenting tool is stopped in a range not exceeding the foundation layer. On the other hand, the load for measuring the resistance value was constantly set to 150 mN. In the measurement, six test pieces were used, and the forming condition and the thickness of the foundation film were changed. A square shaped portion, as shown within FIG. 8, represents the hardness and the range of the resistance value. As can be seen from FIG. 8, when the film hardness is 250 Hv or more in a V-area, the resistance value is stably 2 Ω or less. In contrast to this, when the film hardness is 240 Hv or less in an X-area, the resistance value is changed from 1 Ω to 8 Ω. FIGS. 9 and 10 show the life test results at this time.

FIG. 9 shows the results in which the life of a test piece having the hardness of the X-area is tested 400 times. FIG. 10 shows the results in which the life of a test piece having the hardness of the Y-area is tested 400 times. In both these figures, the axis of abscissa represents the number of contact times, and the axis of ordinate represents the resistance value with respect to the pad formed on the face opposed to the probe forming face. As can be seen from FIG. 9, the resistance value is greatly changed, since the film is soft and the probe tip portion is broken. In contrast to this, as seen in FIG. 10, since the film is hard, the breaking of the probe tip portion is small and the resistance value is stable. The initial resistance value shown in FIG. 10 is more or less high, because there is dirt on the probe surface, but this dirt is dropped during repeating contact during the life test, so that the resistance is stably set thereafter to a normal value.

It is considered from the above description that such a difference in the resistance value due to the film hardness closely relates to the pressurizing force applied to the electrode pad. A probe tip structure having excellent reliability can be obtained by combining the probe tip structure of the present invention and a structure for applying a uniform pressing force. In other words, if the conventional irregular bump has a structure for applying a appropriate uniform pressing force, there is a possibility that a contact probe having high reliability will be easily obtained.

In the irregularities formed on the probe of the substrate for inspection, about 45 projections are formed within a probe tip area of 100 square μm. A preferable range is a range in which 10 to 100 irregularities exist within the probe tip area of 100 square μm.

As mentioned above, as a result of the application of the present invention to various kinds of inspections using the substrate for inspection as explained above, the contact resistance of the electrode pad of the wafer to be inspected and the probe end terminal will have a low value, such as 2 Ω or less, and a test frequency of 100 MHz or more is also obtained. At that time, the temperature atmosphere is changed from room temperature to 150° C., but the electrode pad of the wafer and the probe very preferably come in contact with each other. In accordance with the present invention, an explanation has been made using a wafer as an object of the inspection. However, for example, the present invention also can be applied to the inspection of a bare chip or the inspection of an element forming a solder ball therein. The present invention also can be particularly used in a contact application to a tape for a socket for burn-in. Since a flaw in the electrode pad is shallow in a device such as a semiconductor element or a semiconductor chip, etc. inspected in accordance with the present invention, a product having an electrode pad with low damage can be produced. Therefore, when the solder ball is formed after the inspection, the solder ball can be preferably formed, and the same electrode pad also can be used at another inspecting time.

As mentioned above, it is possible to perform an electrical inspection with high reliability of electrodes at a narrow pitch, and the inspected semiconductor element or electronic part can be very inexpensively provided.

Figure 11:
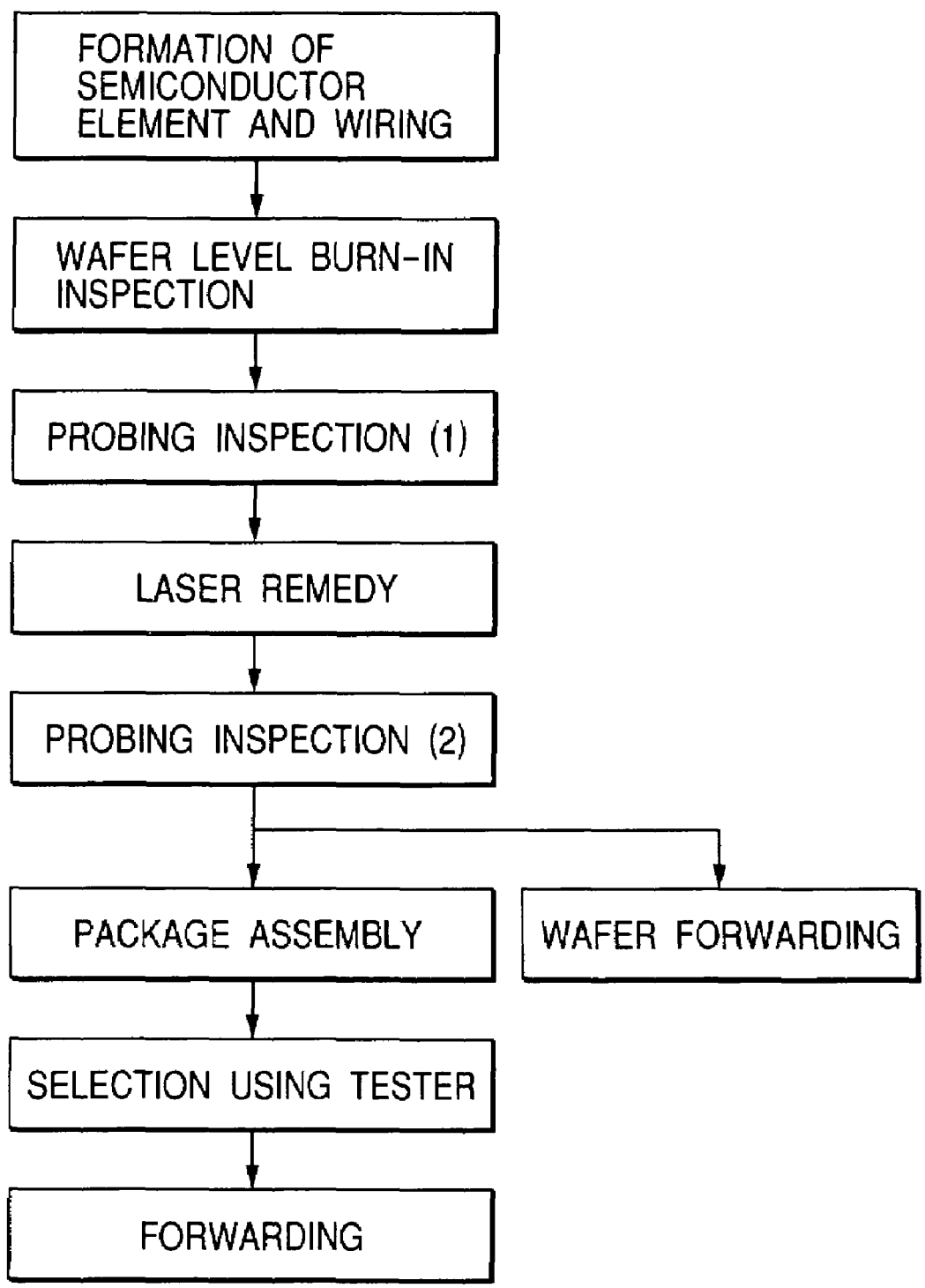
FIG. 11 is a flow diagram of the process of manufacture of a semiconductor device relating to one embodiment of the present invention.
Figure 12:
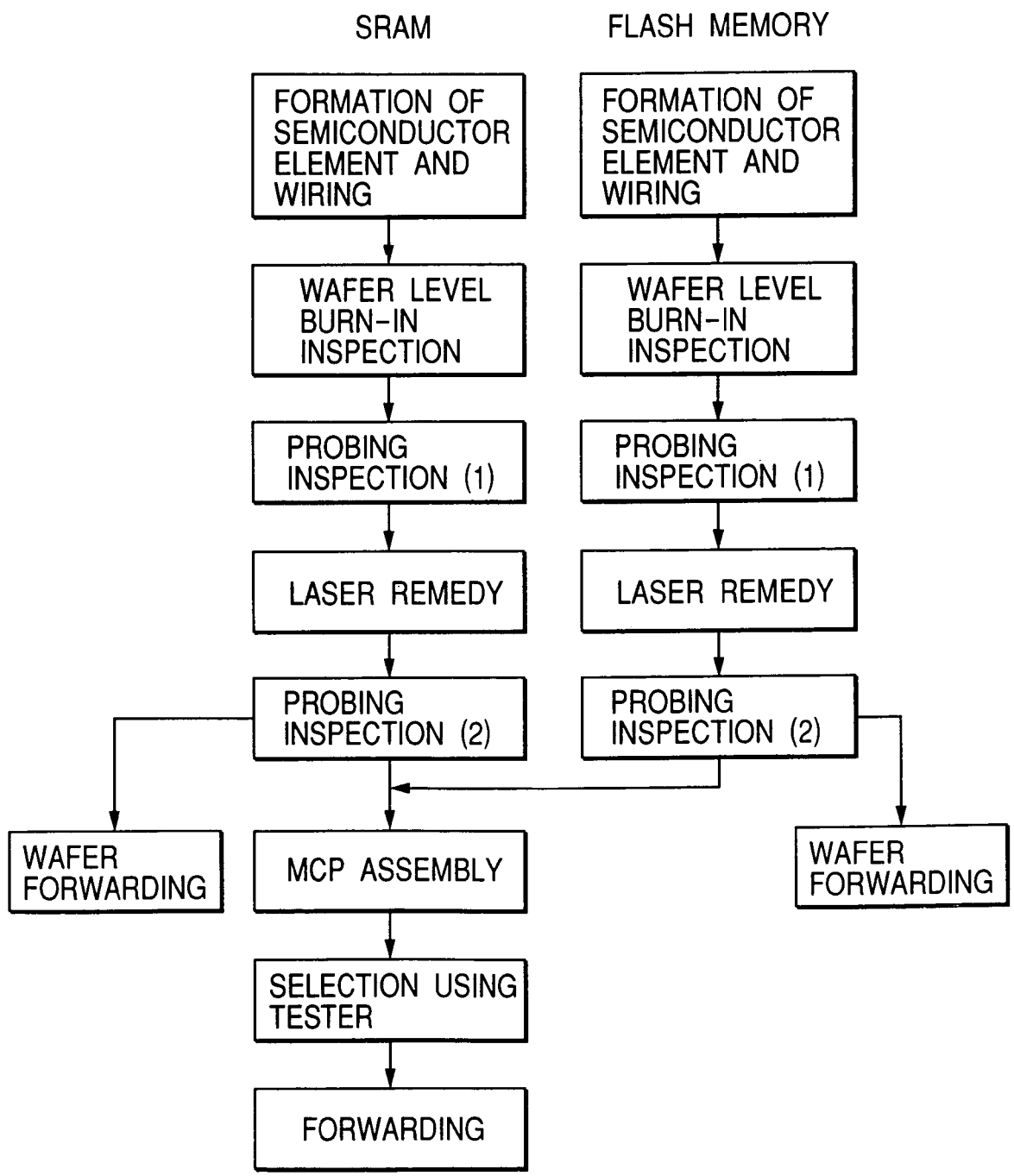
FIG. 12 is a flow diagram of the process of manufacture of a semiconductor device relating to one embodiment of the present invention.

Next, the process of manufacture of a semiconductor device, including the above-described probing inspection and a burn-in inspection, will be explained with reference to FIGS. 11 and 12. FIG. 11 is a flow chart showing the manufacturing process that is used when a semiconductor package is manufactured from one semiconductor chip. FIG. 12 is a flow chart showing the manufacturing process that is used when an MCP (Multi Chip Package) formed from plural kinds of semiconductor chips is manufactured.

As shown in FIG. 11, when a semiconductor package is manufactured from one semiconductor chip, a semiconductor element and wiring are first formed in a semiconductor wafer that is partitioned into plural semiconductor chip forming areas by a dividing area. Subsequently, a burn-in inspection is carried with respect to this semiconductor wafer by using the substrate for inspection according to this invention. When a defective portion is detected by this burn-in inspection, a factor causing this defective portion in the process for forming the semiconductor element and the wiring is determined, so that the quality of the semiconductor package can be improved. Next, a probing inspection is carried out with respect to the semiconductor wafer. For example, with respect to a circuit (wiring) in which a defective portion is found by above burn-in inspection and probing inspection, a defective remedy processing using a laser for replacing this circuit with a remedy circuit is performed. Next, after the probing inspection is again carried out with respect to the semiconductor wafer, the semiconductor wafer is divided into individual semiconductor chips, and a semiconductor package is manufactured by sealing e.g., by use of resin. Since an inspection in the semiconductor wafer state also can be made, the semiconductor package can be set to a forwarding mode in the semiconductor wafer state without dividing the semiconductor wafer into the individual semiconductor chips. In the manufactured semiconductor package, non-defective products are selected by a tester, and they can be then set to the forwarding mode.

In contrast to this, FIG. 12 shows a process for the manufacture of a MCP, which has a semiconductor chip in which there is formed e.g., a SRAM (Static Random Access Memory), and also a semiconductor chip having an electrical collective erasing type EEPROM (Electric Erasable Programmable Read Only Memory; hereinafter called a flash memory). As shown in FIG. 12, the steps up to the manufacture of each of the semiconductor chip having the SRAM and the semiconductor chip having the flash memory is similar to the steps shown in the flow chart of FIG. 11. Further, each of the semiconductor chip having the SRAM and the semiconductor chip having the flash memory also may be set to the forwarding mode in the semiconductor wafer state without dividing the semiconductor chip into individual semiconductor chips. When the MCP is formed to include the semiconductor chip having the SRAM and the semiconductor chip having the flash memory, the burn-in inspection after assembly of the MCP can be omitted by removing the semiconductor chip having a defective portion found by the burn-in inspection and the probing inspection in advance. Namely, since the cost required to perform the burn-in inspection after the assembly of the MCP can be deleted, the cost required to manufacture the semiconductor device of this embodiment can be reduced. After the formation of the MCP, a non-defective MCP can be selected by a tester and can be set to the forwarding mode.

As mentioned above, the invention made by the present inventors has been explained on the basis of various embodiments of the invention. However, the present invention is not limited to the above-described embodiments, but can be variously modified within a scope not departing from the gist of the invention.

The above-described embodiments are directed to the case in which inspection is carried out with respect to a semiconductor wafer which is constructed of plural semiconductor chip forming areas having a predetermined number of semiconductor elements and wirings that are inspected using the substrate for inspection in accordance with the present invention. However, the inspection also may be carried out with respect to a semiconductor chip or a semiconductor wafer during the formation of these semiconductor elements and wirings.

Further, the substrate for inspection are provided in the above-described embodiments can be widely applied to a characteristic inspection of the semiconductor chip or a semiconductor wafer having an electrode pad that is finely formed.

The present invention can provide a method of manu7facture that is capable of improving the manufacturing yield in a semiconductor manufacturing process and of reducing manufacturing cost, by providing a process for reliably making contact with a suitable pressing force, while restraining any damage to the electrode pad, even in the case of inspection of many electrodes, and that is able to provide a semiconductor device which can be inexpensively manufactured and have a high reliability as a result.

What is claimed is:

1. A method of manufacture of a semiconductor device comprising a process for forming the semiconductor device on one principal surface of a wafer; and a process for inspecting for a defect in the semiconductor device formed in said wafer; wherein a substrate for effecting an inspection in said inspecting process includes a beam, a probe of a projecting shape projecting from said beam for coming in contact with an electrode of the semiconductor device to be inspected, and a secondary electrode electrically connected to said probe through an electrically conductive member, which is disposed on the side of the substrate opposed to the side on which said probe is formed; and the inspecting process includes a step of contacting a surface of said probe, said surface having many irregularities, with an electrode of said semiconductor device.

2. The manufacturing method according to claim 1, wherein said probe has a substrate portion constituting said projecting shape, a foundation layer formed on said substrate portion and having irregularities greater than those of said substrate portion surface, and an electrically conductive layer formed on said foundation layer.

3. The manufacturing method according to claim 2, wherein said foundation layer has nickel as a principal component, and said electrically conductive layer has gold as a principal component.

4. The manufacturing method according to claim 2, wherein said substrate portion is constructed by a semiconductor material, and said electrically conductive layer includes one of rhodium, ruthenium, cobalt, chromium, tungsten and gold as a main constructional element.

5. The manufacturing method according to claim 2, wherein a material harder than the electrically conductive layer is arranged in said probe substrate portion.

6. The manufacturing method according to claim 2, wherein said electrically conductive layer and said foundation layer are formed such that the interface of said foundation layer is coarser than the interface or the surface of said electrically conductive layer.

7. The manufacturing method according to claim 2, wherein said foundation layer surface is formed from a rectangular irregular face.

8. The manufacturing method according to any one of claims 1 to 6, wherein a granular projection is formed in said probe and said secondary electrode.

9. The manufacturing method according to claim 1, wherein the surface of said electrically conductive member arranged on the same side as said probe is formed such that irregularities formed on the surface of said electrically conductive member are smaller than irregularities formed on said probe.

10. A method of manufacture of a semiconductor device comprising a forming process for forming a semiconductor device on one principal surface of a wafer; and an inspecting process for performing an inspection by moving an inspecting device into electrical contact with the semiconductor device formed in said wafer; wherein said inspecting device has:
  a substrate;
  at least one probe formed on one principal surface of said substrate, said at least one probe each having a surface having many irregularities;
  wiring formed on the principal surface of said substrate on which said probe is formed and which is electrically connected to said probe; and
  an electrical connecting substrate arranged opposite to a face on the side opposed to said principal surface of said substrate and having a mechanism electrically connected to said wiring, wherein
  said inspecting process includes a process for bringing said probe into electrical contact with an electrode formed in said semiconductor device, thereby conductively connecting said inspecting device and said semiconductor device.

11. The manufacturing method according to claim 10, wherein an electrically conductive film that is higher in electrical conductivity than said substrate and a protecting film lower in electric conductive property than said electrically conductive film are formed in said wiring.

12. The manufacturing method according to claim 10, wherein irregularities greater than Those on the surface of said wiring are formed on the surface of said probe.

13. The manufacturing method according to claim 10, wherein irregularities greater than those of the substrate around said probe are formed on the surface of said probe and the surface of said wiring.

14. A method of manufacture of a semiconductor device comprising a forming process for forming a semiconductor device on one principal surface of a wafer; and an inspecting process for inspecting the semiconductor device formed in said wafer to detect a defect; wherein the inspecting process employs an inspecting device, having at least one probe, which includes a semiconductor substrate having a probe portion having a projecting shape and a probe support portion that is physically continuously connected to said probe portion, at least one of said at least one probe each having an electrically conductive layer having many irregularities formed on said projecting shape, and a secondary electrode formed on the side of said substrate opposed to the side on which said projecting shape is provided, and which is electrically connected to said electrically conductive layer through an electrically conductive member that is formed on the side of said substrate having said projecting shape and on the opposed side thereof; and said inspecting process includes a process for bringing the inspecting device electrical contact with an inspecting electrode of said semiconductor device.

15. The manufacturing method according to claim 1, wherein said irregularities of said surface of said probe are plural micro-projections of said surface of said probe.

16. The manufacturing method according to claim 10, wherein said irregularities of said surface of the probes having irregularities, are plural micro-projections of said surface.

17. The manufacturing method according to claim 14, wherein said irregularities of said electrically conductive layer are plural micro-projections of said electrically conductive layer.

* * * * *